US006387588B1

(12) United States Patent
Katano et al.

(10) Patent No.: US 6,387,588 B1
(45) Date of Patent: May 14, 2002

(54) PLATE MATERIAL FOR PRINTING METHOD BASED ON WETTABILITY CHANGE

(75) Inventors: Yasuo Katano, Kanagawa; Nobuyuki Miyazaki, Tokyo; Katsuji Ito, Kanagawa, all of (JP)

(73) Assignees: Ricoh Company, Ltd.; Asahi Glass Company Ltd., both of Tokyo (JP)

( * ) Notice: Subject to any disclaimer, the term of this patent is extended or adjusted under 35 U.S.C. 154(b) by 0 days.

(21) Appl. No.: 09/545,331

(22) Filed: Apr. 7, 2000

(30) Foreign Application Priority Data

Apr. 9, 1999 (JP) .......................................... 11-102405

(51) Int. Cl.[7] .......................... G03F 7/004; B41M 5/26

(52) U.S. Cl. ................................ 430/270.1; 430/286.1; 101/453; 101/130; 428/195; 428/913

(58) Field of Search .......................... 430/270.1, 281.1, 430/286.1; 428/195, 913; 503/201; 101/453, 130

(56) References Cited

U.S. PATENT DOCUMENTS

| | | | |
|---|---|---|---|
| 5,175,568 | A | 12/1992 | Oyamaguchi et al. |
| 5,177,506 | A | 1/1993 | Katano |
| 5,200,762 | A | 4/1993 | Katano et al. |
| 5,278,126 | A | 1/1994 | Katano et al. |
| 5,335,001 | A | 8/1994 | Katano |
| 5,369,421 | A | 11/1994 | Tomono et al. |
| 5,436,642 | A | 7/1995 | Oyamaguchi et al. |
| 5,471,234 | A | 11/1995 | Katano et al. |

FOREIGN PATENT DOCUMENTS

| | | |
|---|---|---|
| JP | 40-18992 | 8/1965 |
| JP | 40-18993 | 8/1965 |
| JP | 44-9512 | 5/1969 |
| JP | 63-264392 | 11/1988 |
| JP | 3-178478 | 8/1991 |
| JP | 9-52437 | 2/1997 |
| JP | 09052437 A * | 2/1997 |
| JP | 09315004 A * | 12/1997 |

OTHER PUBLICATIONS

JPO machine translation of JP 09–52437; p. 1–15; http://www4.ipdl.jpo.go.jp/cgi–bin/tran__web__ejje.*

JPO machine translation of JP 09–315004; p. 1–5; http://www4.ipdl.jpo.go.jp/cgi–bin/tran__web__cgi__ejje.*

Nakoki Negishi, et al., "Photo–Induced Reversible Change on Wettability on Photochromic Polymer Surface," Japanese Journal of Polymer Science and Technology (Kobunshi Ronbunshu), vol. 37, No. 4, Apr. (1980), pp. 287–291. (with English Abstract).

Takanori Saito, et al. "A Theory of the Contact Angle in Consideration of the Friction between Liquid Drop and Solid Surface," Japan Contact Adhesive Association Bulletin (Nihon Seccyaku Kyohai–shi), vol. 22, No. 12, (1986), pp. 627–638. (with English Abstract).

* cited by examiner

*Primary Examiner*—Rosemary Ashton
*Assistant Examiner*—Yvette M. Clarke
(74) *Attorney, Agent, or Firm*—Oblon, Spivak, McClelland, Maier & Neustandt, PC

(57) ABSTRACT

There is provided a plate material for printing method based on wettability change. The plate material is comprised of a substrate and a recording layer including at least two polymers having a first polymer and a second polymer surrounding the first polymer. The first polymer has a changeable property of a receding contact angle and is comprised of a copolymer including perfluoroalkyl-containing acrylate or perfluoroalkyl-containing methacrylate. The second polymer has an oil-absorptive character defined as an area ratio determined in the specification and is comprised of a urethane polymer. The printing plate according to the present invention exhibits excellent ink-releasability and no toning during printing operation.

15 Claims, 1 Drawing Sheet

PLATE MATERIAL FOR PRINTING METHOD BASED ON WETTABILITY CHANGE

BACKGROUND OF THE INVENTION

1. Field of the Invention

The present invention relates generally to a plate material for printing, and more particularly to the plate material suitable for a printing method which comprises the steps of forming a liquid-attractive region (a latent image-forming region) selectively on a highly liquid-repellent surface of a printing plate, or of forming a liquid-repellent region (also, a latent image-forming region) selectively on a highly liquid-attractive surface of a printing plate, providing a recording liquid (for example, a liquid ink in a state of solution or dispersion) on the latent image-forming region, and then transferring the recording liquid to a plain paper or the like so as to produce an image.

2. Description of the Related Art

There has been an offset printing method by use of a waterless printing plate, as a representative printing method for use in forming an image by producing both a liquid-attracting region and liquid-repellent region on a surface of a printing plate. In practice, however, it is very difficult to incorporate all of the processes including a plate-making step and a printing step within a single apparatus in this offset printing method. This makes it difficult to have a compact apparatus in which the above steps can be performed.

For example, even in a case of relatively compact offset printing method, there are generally separate plate-making apparatus and printing apparatus. In addition, most materials for printing plate are usually pre-sensitive plates comprising a support and a photosensitive layer provided thereon and it is customary to discard these plates after single use for printing.

For the purpose of eliminating this defect of the offset printing method, there has been proposed a recording method and apparatus in which areas having a liquid-attractive property and areas having a liquid-repellent property can be generated on a recording medium in response to an image information and also in which the repeated usage of above recording medium is possible, that is, a printing process is reversible. The following are some of these.

(1) Water-soluble Developing Method

After a charge is externally applied on a hydrophobic photo-electric conductive layer, the layer is exposed to light and a pattern can be formed which have both a hydrophobic portion and a hydrophilic portion on a surface of the layer. A water-soluble developing liquid adheres to only the hydrophilic portion and it is in turn transferred to a paper or the like, thus producing an image. Such method and apparatus are disclosed in Japanese Patent Publication Nos. 40-18992, 40-18993 and 44-9512, and Japanese Patent Laid-Open Application No. 63-264392.

(2) Method Based on Photochemical Response of a Photochromic Material

In this method, ultraviolet light is irradiated to a layer including a material such as spiropyran or an azo dye so that a photochemical reaction of above dye occurs to make the layer hydrophilic. Such method and apparatus is described in "Japanese Journal of Polymer Science and Technology (Kobunshi Ronbunshu)" Vol. 37, No. 4 p287 (1980).

(3) Method Based on an Action of an Internal Biasing Force

Japanese Laid-Open Patent Application No. 54-41902 describes a method whereby a portion to which a liquid ink adheres or does not adhere can be formed by physical transformation between an amorphous state and a crystalline state on a recording medium.

According to the above-mentioned method(1), after the water-soluble ink is transferred to the paper or the like, the hydrophilic portion is removed by removing the charge so that it is possible to record a next image. That is to say, one original plate (photo-electric conductive body) offers a repeated printing. However, since this method, in principle, employs electrophotographic process, it requires a long complicated process comprising charging, exposing, developing, transferring and discharging so that there are accompanying problems with making the apparatus based on the method (1) compact, in conjunction with reduction of a cost and maintenance-free operation.

With respect to method (2) described above, it is possible to freely control reversibility between hydrophilic and hydrophobic properties by selective irradiation of ultraviolet and visible light. However, since a quantum efficiency of reversibility is very low, a response time is extremely long and a recording rate is slow. In addition, there is provided the defect of an image stability. Therefore, this method (2) has not still reached a level of practical application.

Furthermore, although a information recording member which is used in the method (3) previously described has good stability after achieving a recording, there may be occasions that a structural transformation takes place due to temperature changes prior to the recording, thus giving rise to a stability problem. Additionally, a removal of a recorded information pattern requires means for applying a thermal pulse followed by rapid cooling so that it is difficult to perform frequent repetition of an image formation.

As described above, there has been a long-felt need to provide a printing method and printing material which are suitable for a compact printing apparatus. In order to accomplish this end, Japanese Laid-Open Patent Application Nos. 3-178478 and 9-52437 disclose a novel and useful recording method and recording medium therefor comprising a base member and a recording layer provided on thereon, having a characteristic in which a receding contact angle of the recording layer decreases against a liquid when the recording layer is heated or cooled in contact with the liquid. However, there is another problem that a surface of the above recording medium is likely to subjected to scratch so that a scratched portion tends to attract an ink, thereby generating a toning and an insufficient plate wear.

SUMMARY OF THE INVENTION

Accordingly, it is a general object of the present invention to provide a material for a printing plate in which the disadvantages of the aforementioned prior art are eliminated.

A more specific object of the present invention is to provide a material for the printing plate, having a good ink releasibilty and improved printing durability so that a number of good quality image can be obtained on a plain paper or the like.

The inventors of the present invention have performed much research and investigation regarding a material for printing plate in which the faults described for the conventional technologies have been eliminated.

The above objects of the present invention are achieved by a plate material for printing which comprises a substrate and a recording layer provided on the substrate, a surface of the recording layer having a changeable property of a receding contact angle, the recording layer comprising at least two polymers including a first polymer and a second polymer, the first polymer having the changeable property of the receding contact angle, wherein the second polymer has an oil-absorptive character defined as an area ratio determined by immersion test with a given solvent, and wherein the area ratio is in a range of from 110% to 200%.

According to the present invention, there is provided a plate material for printing for use in a recording method comprising in an arbitrary order the following steps of:

(a) bringing a contact material into contact with a surface of a recording layer, the surface having a property in which a receding contact angle decreases when the recording layer is heated in a state where the recording layer is in contact with a liquid, the contact material being selected from a liquid, a vapor and a solid which generates or changes to either a vapor or a liquid under condition of a temperature lower than a temperature at which the receding contact angle on the recording layer starts to decrease; and (b) selectively heating the surface of the recording layer in response to an image information, whereby an area is formed with a receding contact angle in response to a heating temperature on the recording layer, the plate material comprising:

a substrate; and the recording layer provided on the substrate, the surface of the recording layer having a changeable property of the receding contact angle, the recording layer comprising at least two polymers including a first polymer and a second polymer, the first polymer having the changeable property of the receding contact angle, wherein the second polymer has an oil-absorptive character defined as an area ratio determined by immersion test with a given solvent, and wherein the area ratio is in a range of from 110% to 200%.

The above objects of the present invention are also achieved by a plate material for printing for use in a recording method comprising the step of:

selectively heating a surface of a recording layer, the surface having a property in which a receding contact angle which was pre-decreased when the recording layer was heated in a state where the recording layer was in contact with a liquid changes into a original state when the recording layer is heated in an air in the absence of a liquid, whereby an area is formed with a receding contact angle in response to a heating temperature on the recording layer, the plate material comprising:

a substrate; and the recording layer provided on the substrate, the surface of the recording layer having a changeable property of the receding contact angle, the recording layer comprising at least two polymers including a first polymer and a second polymer, the first polymer having the changeable property of the receding contact angle, wherein the second polymer has an oil-absorptive character defined as an area ratio determined by immersion test with a given solvent, and wherein the area ratio is in a range of from 110% to 200%.

An advantage of the present invention is the provision of a material for printing plate, the material having good ink releasibility so that a toning during press can be eliminated.

Furthermore, according to the present invention, it is possible to provide an improved printing plate which exhibits its good printing durability.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1A:
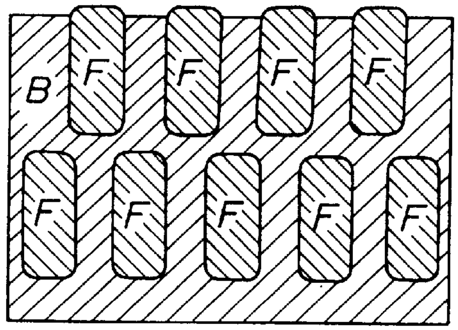
FIG. 1A shows a schematic microstructural view of a recording layer according to the present invention right after formation of an image.

The present invention will be explained with reference to the following examples and figures. For convenience, "a polymer having a changeable property of a receding contact angle" is hereinafter abbreviated to "F polymer", and "a polymer having an oil-absorptive property" is hereinafter abbreviated to "B polymer".

Japanese Laid-Open Patent Application No. 9-52437 describes a printing plate material comprising a F polymer and a binder polymer surrounding the F polymer (hereinafter abbreviated to B' polymer) so as to form a hard recording layer. Because of surround of the F. polymer by the B' polymer, even if a part of an uppermost surface of the F polymer contacts with a paper during printing operation, the F polymer can not be significantly damaged due to blocking of the B' polymer around the F polymer. In addition, the changeable property of the receding contact angle for the F polymer can be maintained because of maintenance of a microdomain structure of the F polymer in the recording layer.

The inventors have also discovered that a material having a surface showing a character in which the receding contact angle becomes smaller after heating and cooling in a state where the surface is in contact with a liquid, and in which the receding contact angle becomes larger by heating in absence of the liquid, is effective as a plate material. The surface of the above plate material has the two following character:

(A) The surface is a member which includes an organic compound having a surface self-orientation function of a hydrophobic group; or (B) The surface is a member which includes an organic compound having a hydrophobic group oriented to the surface.

In the above (A), the term "surface self-orientation function" refers to an orientation character whereby the hydrophobic group at the surface is oriented towards a side of an air (i.e., the side of the free surface) when a solid which has a compound formed on supporting body, or a solid formed of a compound itself is heated in air. The same applies to the above (B). Generally speaking, an organic substance exhibits a phenomenon wherein a hydrophobic group tends to orient towards a side of a hydrophobic atmosphere. This is a phenomenon which occurs when the orientation is towards the side where an interfacial energy of solid-gas boundary becomes lower. In addition, this phenomenon is remarkable for longer chain of the hydrophobic group of a molecule. This is why when the molecules are heated, those which have the longer chain exhibit the larger mobilities.

More specifically, in a case of a molecule which has a hydrophobic group at its end (i.e., a molecule in which the surface energy is low), the hydrophobic group is likely to orient in a direction of the side of the air (i.e., the side of the free surface). In the same manner, in a case of a molecule having a linear chain including $—(CH_2)_n—$ (n is a integer which is more than 12.), molecular chains are tend to orient each other due to the presence of crystalline region of $—(CH_2)_n—$ portion. Like $—(CH_2)_n—$ portion, a molecule including a phenyl group is likely to orient together with that of other molecule because of a flat structure of the phenyl group. Furthermore, a linear molecule including a high electronegative element such as a fluorine atom has a high self-aggregation character. This makes it easy to orient molecular chains each other.

To summarize the results of these investigations, it is desirable for surface self-orientation function to have the linear molecule having the high self-aggregation character, the flat structure and the hydrophobic group at its end, and to have a compound which includes a linear molecule.

As is clear from the foregoing discussion, there is a relationship between the surface self-orientation function and the receding contact angle. In addition, there is also a relationship between the receding contact angle and the liquid adhesiveness. That is, adhesion of the liquid towards the surface of the solid is mainly created by tacking of the liquid at the surface of the solid. This tacking phenomena can be regarded as a kind of friction when the liquid slides on the surface of the solid. Accordingly, when the above frictional force is γf, the receding contact angle θr in the present invention can be expressed as follows: (Saitoh, Hokuzaki et. Al "Japan Contact Adhesive Association Bulletin (Nihon Seccyaku Kyohkai-shi)" Vol:22, No.12, No. 1986)

$$\cos\theta r=(\gamma/\gamma 1v)\cdot(\gamma s-\gamma s1-\pi e+\gamma f)$$

wherein:

γ: surface tension of the solid in vacuum;

γs1: interfacial tension at the solid-liquid interface;

γ1v: surface tension of the liquid in equilibrium with its saturated vapor;

πe: equilibrium surface pressure;

γf: frictional force; and

γs: surface tension of the solid in absence of a adsorptive layer.

Accordingly, when a value of θr becomes lower, a value of γf becomes greater. This is to say, the liquid slides less easily over the surface of the solid, thus resulting in good adhesion to the surface of the solid.

As can be assumed from these mutual relationship, the adhesiveness of the liquid depends upon the receding contact angle θr. This receding contact angle θr is determined by the material having a surface with a surface self-orientation function. The printing plate material according to the present invention requires a developing step of a latent image on the surface of the plate by formation of a desired pattern area and/or a recording agent, and the plate material must inevitably be a member for which the surface self-orientation function is selected.

The plate material for printing according to the present invention is one that has a surface for which the receding contact angle θr becomes smaller when the plate material is heated and comes into contact with a liquid.

The surface of the plate material exhibits either hydrophobic or hydrophilic properties of a liquid-adhesive area, that is a latent image area, depending on a kind of a contact material. Therefore, in a case where printed materials having an image is obtained, either an oily ink or a water-soluble ink can be used according to necessity.

A base member may be in any form of a belt, plate and drum, and the form of the base member can be selected according to usage of an apparatus. Preference is given to a drum-shape base member because of dimensional accuracy. A size of the base member can be determined in accordance with a size of a recording paper.

The following will be a description of the contact material.

The contact material is either a liquid or a vapor from its initial state, or is a solid which ultimately becomes a liquid at a temperature less than a commencement temperature for lowing the receding contact angle θr of the plate material. This vapor herein used becomes a liquid when at least one portion of it condenses in the vicinity of the surface or on the surface of the plate material. It is desirable that this liquid can wet the surface of the plate material. On the other hand, the solid herein used is one that either becomes a liquid, or generates a liquid, or generates a vapor, at the temperature less than the commencement temperature for lowing the receding contact angle θr mentioned above. The vapor generated from the solid condenses in the vicinity of the surface or on the surface of the plate material to produce a liquid.

The following is a more specific example of this contact material. Examples of the liquid as the contact material include, in addition to water, water solution containing an electrolyte, alcohol such as ethanol and n-butanol, polyalcohol such as glycerine and ethylene glycol, a polar liquid including ketone such as methyl ethyl ketone ot the like, linear chain hydrocarbon such as n-nonane, n-octane, cyclic hydrocarbon such as cyclohexane, a non-polar liquid such as aromatic hydrocarbon, for example, m-xylene and benzene. Preference is given to a polar liquid. These liquid may be used alone or in admixture. A variety of dispersion inks and liquid inks can be also used.

In addition to water vapor, examples of vapors as the contact material include vapors of the above liquid as the contact material. Preference is given to a vapor of an organic compound such as ethanol and m-xylene (including those which are mist state). The temperature of these organic vapors must be less than the softening point or the less than the melting point of a compound which forms the surface of the plating material.

Examples of a solid as the contact material include higher fatty acids, low molecular weight polyethylene, macromolecule gels (including polyacrylamide gel, polyvinyl alcohol gel), silica gel, and hydrated compounds.

Although it will be explained in detail later, it should be noted that when the contact material is a "a recording agent which contains a colorant" such as the previously mentioned liquid inks, the formation of the latent image and the developing of the image are carried out simultaneously.

The following is a description of a heating apparatus. Examples of the heating apparatus include a heater, a contact heating apparatus such as a thermal head or the like, and a non-contact heating apparatus that uses electromagnetic radiation (such as a laser light, a infra-red radiation lamp or some of type of light that is irradiated from a light source and focused through a lens). In addition, electron beam irradiation or ultra-violet light irradiation can be also achieve the method of the present invention if there is effective heating.

FIG. 1A illustrates a microstructure model of a F polymer surrounding a binder B polymer having an oil-absorptive property, in which the F polymer exhibits a changeable property of a receding contact angle.

Figure 2A:
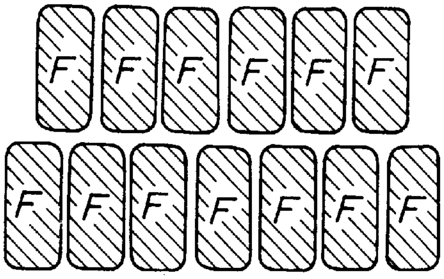
FIG. 2A shows a schematic microstructural view of a recording layer of comparative example in the present invention right after formation of an image.
Figure 2B:
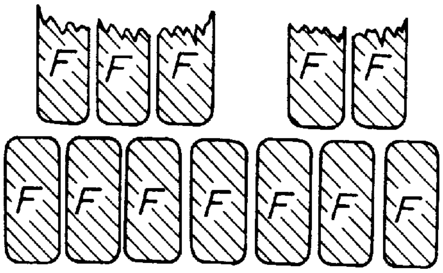
FIG. 2B shows a schematic microstructural view of a recording layer of comparative example in the present invention after repeated printing.

FIG. 2A shows a microstructure model of a only F polymer. Because of strong orientation character of the F polymer, the structure of the F polymer itself is estimated to have not an uniform structure forming a single crystal consisting of molecules well-oriented but a microdomain structure including molecules oriented to some extent. In FIG. 2A, one block represents a domain. As shown in FIG. 2B, when the F polymer contacts with a paper or the like, it may be understood that a surface of the F polymer molecule can be partially broken mechanically so that a scratch or a depression may be formed in the F polymer.

Figure 1B:
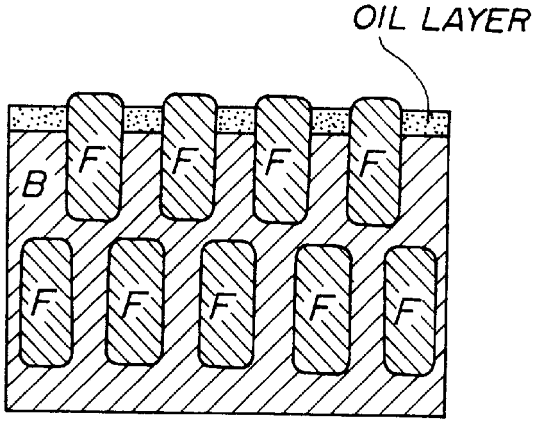
FIG. 1B shows a schematic microstructural view of a recording layer according to the present invention after repeated printing.

On the other hand, as shown in FIG. 1A, in a case of placement of the B polymer surrounding the domain of the F polymer, a surface of the B polymer contacts with an ink selectively, as illustrated in FIG. 1B, so as to form an oil layer on the surface of the B polymer due to rapid absorption of a solvent contained in the ink into the B polymer. This makes it impossible for the ink to adhere to the printing plate. In addition, since the F polymer keeps its micro-domain structure in a film state, a changeable property of the receding contact angle can not vary.

In other words, when the receding contact angle becomes higher, the ink can not adhere to the printing plate due to a synergistic effect with ink releasability of the B polymer. Conversely, when the receding contact angle becomes lower, the ink can adhere to the printing plate due to overthrow of ink releasability of the B polymer.

As is clear from the above consideration, a technical key feature of the present invention resides in a surface layer of the printing plate, that is to say, a recording layer, which comprises the F polymer exhibiting a changeable property of the receding contact angle and the B polymer surrounding the F polymer.

The F polymer according to the present invention comprises a polymer having a changeable property of the receding contact angle. It is preferable that the F polymer comprises a polymer having a fluorine atom, more preferably a fluorine atom at its side chain. Japanese Laid-Open Patent Application No. 3-178478 discloses the F polymer suitable for the present invention. As an alternative polymer not having the fluorine atom, it is possible to use a polymer having a long alkyl group at its side chain, for example, lauryl or stearyl group.

In order to provide the changeable property of the receding contact angle on the surface layer of the printing plate, it is required to project a part of the F polymer from the uppermost surface of the printing plate. Formation of the recording layer can usually be carried out by coating a coating liquid. Although the B polymer mixes well with the F polymer when a molecular structure of the B polymer is similar to that of the F polymer, there may be occasions that the F polymer is unlikely to project selectively from the uppermost surface of the recording layer during a drying step after coating. When a content of the B polymer is larger than that of the F polymer, there may be also occasions that the surface of the recording layer is mainly covered by the B polymer.

In the course of the investigation performed by the present inventors, it was found that the F polymer tends to project selectively from the uppermost surface of the recording layer even if a content of the F polymer is lower in the coating liquid when the F polymer is a polymer comprising a hydrophobic group at its side chain, for example, a long alkyl group, and a fluorine atom at its side chain. Furthermore, the F polymer having the above hydrophobic group exhibits an excellent changeable property of the receding contact angle of the recording layer. In particularly, since a surface energy of the F polymer including the fluorine atom is low, the F polymer is likely to orient towards an air whose surface energy is similarly low. Because of this property of the F polymer, it may be understood that the F polymer migrate towards the uppermost surface of the recording layer during the drying step after coating so as to project from the uppermost surface. Accordingly, as the F polymer suitable for the printing plate in the present invention, preference is given to the F polymer having the fluorine atom at its side chain.

As the F polymer having the fluorine atom at its side chain, it is desirable that a copolymer is comprised of the following monomer as a polymer unit:

$CH_2{=}CRCOOR^f$;

$CH_2{=}CROCOR^f$;

$CH_2{=}CRC(O)R^f$;

$CH_2{=}CROR^f$;

$CH_2{=}CRCONHR^f$;

$CH_2{=}C(CH_2R)COOR^f$; and $CH_2{=}CR(CH_2)_nR^f$, wherein R is either hydrogen, methyl or a fluorine atom, and $R^f$ represent an organic group including the fluorine atom. Examples of $R^f$ are preferably listed as follows (1) through (15);

$—CH_2CH_2C_8F_{17}$ (1)

$—CH_2CH_2C_{10}F_{121}$ (2)

$—CH_2CH_2C_{12}F_{25}$ (3)

$—CH_2(CF_2)_{10}H$ (4)

$—(CF_2)_6—O—CF_2CF_3$ (5)

$—(CH_2)_4—NH—CF_2CF_3$ (6)

$—(CH_2)_{10}—C_8F_{17}$ (7)

$—CH_2NHSO_2C_8F_{17}$ (8)

$—CH_2CH_2—(CF_2)_6CF(CF_3)_2$ (9)

$—CH_2CF_2CF_2CF_3$ (10)

$—CH_2CH_2CH_2CH_2CF_3$ (11)

$—CH_2(CF_2)_6CF_3$ (12)

$—CH_2(CF_2)_5CF_3$ (13)

$—(CH_2)_3—CF_3$ (14)

$—(CH_2)_2(CF_2)_5CF_2Cl$.

A copolymer obtained by copolymerization of the following monomer may be suitable for the present invention;

$CH_2{=}CR^1COOR^2(CF_2)_mF,$ wherein $R^1$ represents hydrogen or methyl, $R^2$ is $—(CH_2)_p—$ or $—(CH_2)_q—N(R^3)SO_2—$, where p is an integer, p≧1, $R^3$ is either methyl or ethyl, q is an integer, q≧1 and m is an integer, m≧4.

More specifically, the following monomers constituting the copolymer are given as the most preferable compound for use as the F polymer of the present invention:

$CH_2{=}C(CH_3)COO(CH_2)_2(CF_2)_6F$ $CH_2{=}C(CH_3)COO(CH_2)_2(CF_2)_8F$ $CH_2{=}C(CH_3)COO(CH_2)_2(CF_2)_{10}F$ $CH_2{=}C(CH_3)COO(CH_2)_2(CF_2)_{12}F$ $CH_2{=}CHCOO(CH_2)_2(CF2)_6F$ $CH_2{=}CHCOO(CH_2)_2(CF2)_8F$ $CH_2{=}CHCOO(CH_2)_2(CF2)_{10}F$ $CH_2{=}CHCOO(CH_2)_2(CF2)_{12}F$ $CH_2{=}CHCOO(CH_2)_2N(C_2H_5)SO_2(CF_2)_8F$ $CH_2{=}C(CH_3)COO(CH_2)_2N(C_2H_5)SO_2(CF_2)_8F.$

The copolymer forming the F polymer according to the present invention are made of two or more of above monomers, or the above monomer and other copolymerizable monomer. It is desirable that in order to control a content of the fluorine in the copolymer, the copolymer are formed of the above fluorine-containing polymer and a monomer not having the fluorine atom. An amount of the polymer not having the fluorine atom is preferably less than 50% by weight on the basis of a total monomer weight.

It is preferable for other copolymerizable monomer that one or more of compounds having a radically polymerizable unsaturated double bond may be used for the above purpose. Examples of such monomers include acrylates and methacrylates monomer as follows: olefin such as ethylene or the like; vinyl carboxylate such as vinyl acetate or the like; vinyl halide such as vinyl chloride, vinyl fluoride or the like; styrene derivatives such as styrene, α-methylstyrene, p-methylstyrene or the like; alkyl (meth)acrylate such as (meth)acrylic acid, methyl (meth)acrylate, butyl (meth) acrylate, 2-ethylhexyl (meth)acrylate, stearl (meth)acrylate or the like; hydroxyl-containing (meth)acrylate such as 2-hydroxyethyl (meth)acrylate, polyoxyalkylene mono (meth)acrylate or the like; acrylamide derivatives such as (meth)acrylamide, diacetone (meth)acrylamide, N-methylol (meth)acrylamide or the like; vinyl ether derivatives such as alkyl vinyl ether, halogenated alkyl vinyl ether or the like; diene derivatives such as butadiene, isoprene, chloroprene or the like; (meth)acrylates other than the above such as glycidyl (meth)acrylate, aziridinyl (meth)acrylate, benzyl (meth)acrylate, isocyanate ethyl (meth)acrylate, cyclohexyl (meth)acrylate, polysiloxane-containing (meth)acrylate or the like, maleic acid derivatives such as maleic anhydride, dialkyl malate or the like and N-vinylcarbazole or the like.

It is desirable that the F copolymer is made of at least one of (meth)acrylate monomer which has a perfluoroalkyl group indicated as $CH_2{=}CRCOOCH_2CH_2(CF_2)_mF$, wherein R represents hydrogen or methyl, m is a integer more than 4, preferably in a range between 6 and 14. Preferably, the copolymer comprising (meth)acrylate monomer having the perfluoroalkyl group as a repeating unit is also comprised of the above monomer not having the fluorine atom.

A content of the fluorine atom in the copolymer comprising the perfluoroalkyl-containing (meth)acrylate monomer as the repeating unit is preferably in a range of from 30 to 50% by weight. It is also possible to use commercially available copolymer having the perfluoroalkyl group.

Although a method for obtaining the copolymer by use of the above monomer will be described in detail later, it is possible to employ solution polymerization, electrolysis polymerization, emulsification polymerization, photopolymerization, radiation polymerization, plasma polymerization, graft polymerization, plasma-initiated polymerization, deposition polymerization or the like. Preference is given to emulsification polymerization in the present invention.

According to the present invention, it is desirable to form the recording layer by use of a fine particle comprising the F polymer. Methods for producing the fine particle of the F polymer are as follows.

[A Method for Obtaining a Dispersion Solution by Drying and Pulverizing the F Polymer]

For example, polymerization of perfluoroalkyl-containing (meth)acrylate is carried out in trichloro-,trifluoroethane as a solvent. After removing the solvent, a resulting solid is pulverized. The pulverized particle of the F polymer is dispersed in a coating solvent.

[A Method for Obtaining a Water Dispersion Solution Containing a Compulsorily Emulsified F Polymer]

For example, the F polymer is dissolved in an organic solvent, such as methyl isobutyl ketone, which is capable of dissolving the F polymer to form a solution. A water is added to this solution, if necessary, a emulsifier is also added to the solution. Emulsification of the added solution by a high-pressure homogenizer gives a water dispersion of the F polymer after removing the organic solvent.

[A Method for Obtaining a Water Dispersion Containing the F Polymer by use of Direct Emulsification Polymerization of the Above Monomer]

For example, this method uses emulsification polymerization of monomer to be polymerized in water in the presence of an emulsifier while stirring. Examples of initiator include an organic peroxide, an azo-compound, persulfuric acid salt or the like. An ionizable radiation, such as γray, is also used for the initiator. As the emulsifier, it is possible to use various emulsifiers, such as an anionic agent, a cationic agent or a non-ionic agent. Among these, a water-soluble emulsifier is preferred, as described below in detail.

As the method for producing a fine particle of the F polymer, the method is preferably based on compulsory emulsification of the F polymer or emulsification polymerization of the F polymer, and preference is given to emulsification polymerization. Additionally, in a case where a dispersion solution containing the B polymer is prepared, it is possible to pulverize the B polymer to form the dispersion solution by means of the compulsory emulsification method in the presence of the F polymer simultaneously. It is also possible to obtain the dispersion solution of the B polymer by mixing a pre-dispersed solution containing the B polymer with the dispersion solution of the F polymer.

A fine particle diameter of the F polymer is preferably less than 10 μm, more preferably from 0.05 μm to 1 μm. A fine particle diameter of the B polymer is preferably similar to that of the F polymer.

The present invention resides in the B polymer which has oil-absorptive character. With respect to the B polymer, example of this polymer, but are not limited to, include a styrene-butadiene resin, a silicone resin, an urethane resin, and an acrylate resin.

In the present invention, oil-absorptive character is defined as follows. A film comprising the B polymer is formed to have a size of 2 cm×5 cm×100 μm (length×breadth×thickness). After the film is immersed in a n-tetradecane solvent at a temperature of 20° C. or 24 hours, a value of [(area after immersion)/(area before immersion)] is measured as area ratio.

A method for forming a film in the above experiment is comprised of the steps of casting a solution containing the B polymer on a glass plate to form a film, then pre-drying at room temperature followed by at 80° C. for 30 minutes, subjecting to heat treatment at 140° C. for 30 minutes and stripping the film from the glass plate so as to obtain the film for oil-absorptive character experiment. When the film is stripped from the glass plate by use of water or solvent, the resulting film is dried at room temperature for 24 hours.

It may be understood that ink releasability of the B polymer can be explained by WFBL (weak fluid boundary layer) theory. That is to say that when the B polymer contacts with an ink, the B polymer absorbs an organic solvent contained in the ink to form an oil layer on the uppermost surface of the B polymer so that this layer can repel the ink. However, if the B polymer exhibits too strong ink-releasability, there may be arisen a problem related to ink adhesion regardless of the receding contact angle of the F polymer.

As described above, a degree of oil-absorptive character can be defined as the value determined by immersion test with n-tetradecane. In the present invention, inventors have discovered that WFBL theory holds for the printing material according to the present invention and that ink-releasability can be ameliorated and a range in which the ink can adhere to an image area of the printing plate is preferably between 110 and 200. Since it has been found that the B polymer showing large increase ratio in area defined above does not have sufficient mechanical strength due to swelling of the B polymer, the increase ratio in area suitable for the B polymer used in the present invention preferably falls in the range from about 110 to 135%.

It is preferable to use the urethane resin as the B polymer. It is desirable for the urethane resin to use a product formed by reaction of a multi-functional isocyanate compound with a compound with more than one functional group which reacts with an isocyanate group. It is also possible to use an urethane pre-polymer having the isocyanate group and an isocyanate group blocked by a blocking agent. A water-soluble blocking agent is preferred as the blocking agent.

As the multi-functional isocyanate compound, it is possible to use polyisocyanate compound having more then one isocyanate group and derivative thereof. As a derivatives, it is preferable to use nurate, trimethylol and buret derivatives.

It is also possible to use aliphatic multi-functional isocyanate, alicyclic multi-functional isocyanate, aromatic multi-functional isocyanate as the multi-functional isocyanate compound. More specifically, examples of the multi-functional isocyanate compound, but are not limited to, include hexamethylene diisocyanate (HMDI), isophorone diisocyanate (LPDI), xylene diisocyanate (XDI), tolylene diisocyanate (TDI), phenyl diisocyanate (PDI), diphenylmethane diisocyanate (MDI), hydrogenated MDI and derivatives thereof.

As a functinal group which reacts with the isocyabnate group, a hydroxyl group, an amine group, a carboxyl group or the like is preferred. Preference is given to the hydroxyl group for the isocyanate group. It is also preferable to use a compound having more than one hydroxyl group. Examples of such compound, but are not limited to, include polyol compound based on polyether, polyester, polycarbonate materials systems.

It is preferred as the B polymer that hardness of a film comprising the B polymer used in the present invention is higher than that of the F polymer and that with respect to hardness estimated by a pencil, the film comprising the B polymer have higher hardness than HB. The B polymer may be either water-soluble or water-insoluble and solubility of the B polymer is generally dependent on water-solubility of the compound having more than one group which reacts with the isocyanate group. In a case where the B polymer which is water-insoluble is dispersed in water, it is desirable that a emulsified solution comprising the B polymer is formed by addition of a water-soluble emulsifier as described below. More specifically, a method for preparing the emulsified solution comprising the B polymer is not particularly limited, and it is also possible to use emulsified solution commercially available.

Figure 3:
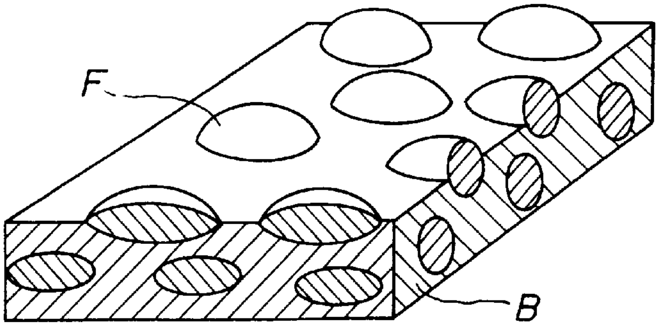
FIG. 3 illustrates a model of an island structure of a recording layer comprising a F polymer and a B polymer according to the present invention.

It is believed that a surface morphology of the recording layer comprising the F and B polymers according to the present invention may be an island structure. FIG. 3 illustrates a conceptual model for the island structure. On one hand, an island represents domain of the F polymer and on the other hand, a sea represents the B polymer. If micro-domain comprising the F polymer overlaps each other, domain comprising the F polymer is easily stripped towards an ink layer side by tacking force of the ink layer during repeated printing process, even in the event of firm surrounding of the F polymer by the B polymer. As shown in FIG. 3, an island-dotted sea structure of the recording layer according to the present invention can be formed by placing the island comprising the F polymer in the sea comprising the B polymer. This makes it impossible for the island comprising the F polymer to be stripped from the recording layer, thus improving printing durability. A diameter of the island comprising the F polymer is preferably from 10 μm, more preferably from 0.05 μm to 1 μm. A density of the island is not particularly limited if the island does not contact each other.

Methods for producing the printing plate according to the present invention are as follows.

(Method 1)

The F and B polymers are dissolved or dispersed in a suitable solvent (e.g., water, ethyl acetate or the like) to form solution or dispersion. This solution or dispersion is coated on a substrate. A coating method utilizes a wet coating technique, such as spray coating, dip coating and blade coating.

(Method 2)

After coating a B polymer solution or dispersion on a substrate, a fine particle of the F polymer is sprayed onto the substrate in a state where a film comprising the B polymer is not solidified or remains sticky. A spraying method employs electrostatic spray coating or the like.

(Method 3)

After deposition of a fine particle of the F polymer on a substrate, this substrate is subjected to impregnation treatment by use of a solution containing the B polymer so as to form a recording layer.

In above three methods, it is possible to design a formation of a recording layer by crosslinking reaction of the B polymer by use of a crosslinking agent or self-crosslinking reaction of the B polymer. With respect to a ratio of the F and B polymers, the ratio of the B polymer is preferably higher than that of the F polymer. A solid content of the B polymer in the recording layer is preferably between 60% by weight and 90% by weight. A thickness of the recording layer is not particularly limited.

In any case, it is desirable that the method for producing the recording layer according to the present invention is to form the surface morphology in which the F polymer is surrounded by the B polymer. As described above, the recording layer is preferably coated by applied the coating solution on the substrate. Even if the F polymer is dissolved in the coating solution, a state of the F polymer may be considered to have microdomain structure. However, since the F polymer is dissolved in the coating solution, there are possibilities that unevenness of product quality may occur or a product yield may be deteriorated due to inability to control a size and a density of the domain structure in the recording layer. Accordingly, the F polymer is pre-dispersed in the coating solution in a fine particle state. After coating on the substrate, the F polymer never fail to have domain structure. Therefore, it is desirable to disperse the F polymer in the coating solution in the fine particle state.

In addition, the B polymer may be dissolved or dispersed in the coating solution. When the B polymer is dispersed in the coating solution in the fine particle state, uniformity of the coating solution containing the F and B polymers can be improved so as to control distribution of the F and B polymers on the surface of the recording layer according to the present invention, or in the vicinity of the surface thereof. That is to say that it is preferred that both the F and B polymers are dispersed in the coating solution in the fine particle state.

Although it is possible to make use of the coating solution both on the a water-soluble basis and an oil-soluble basis, it is at least necessary for the recording layer after drying to be insolubilized by a solvent contained in the ink. Preferably the recording layer may have crosslinking sites. The crosslinking sites may be formed by self-crosslinking reaction or crosslinking reaction induced by the crosslinking agent. A crosslinking method is not limited in particular, it is preferable to heat after coating.

In either case where the F and/or B polymers are dissolved or dispersed in the coating solution, the coating solution is preferably made of mainly water from an environmental viewpoint. In a case where an organic solvent is used as a part of the coating solution, it is possible to use the organic solvent based on glycol, N-methylpyrrolidone, triethylamine or the like. It is preferred that a slight quantity of the organic solvent is used for the coating solution.

According to one embodiment of the present invention, the printing plate can be heated in contact with the liquid at the time of recording. It should be noted that when a water-soluble emulsifier is contained in the coating solution including the F and/or B polymers, the recording layer turns white and becomes opaque at the time of heating in a situation where the recording layer contacts with the liquid. This phenomenon inhibits a recover of the receding contact angle at the time of subsequent heating in an air. In addition, this phenomenon can lead to deterioration of reversibility of the recording layer according to the present invention.

The water-soluble emulsifier is known in the art and when this emulsifier is soluble, a type of this emulsifier is not limited particularly. That is to say that it is preferable to use a cationic, anionic, non-ionic or amphoteric emulsifier. These water-soluble emulsifiers may be used alone or in admixture. A content of the emulsifier is preferably slight. Because a large quantity of the emulsifier is added in the coating solution, the surface of the recording layer becomes rough due to appearance of the emulsifier on the uppermost surface at the time of heating in the contact state with the liquid, thus presenting problems that this portion of the recording layer turns white and becomes opaque. An amount of the emulsifier is preferably less than 10% by weight based on the total weight of the F and B polymers. It is unnecessary to use the emulsifier when the F and B polymers can be dispersed without an aid of emulsifier. In a case where the water-soluble B polymer and the water-insoluble F polymer are used, a content of the water-soluble emulsifier is preferably less than 5% by weight.

The following will be description of the water-soluble emulsifier.

[Non-ionic Emulsifier]

polyoxyethylene alkyl ether indicated by the following formula, $$R—O—(CH_2CH_2)_nH,$$

wherein R represents an alkyl group having 12 to 23 carbon atoms and n is an integer from 10 to 20; polyoxyethylene alkyl phenyl ether indicated by the following formula, $$R—C_6H_4—O—(CH_2CH_2O)_nH,$$

wherein R represents an alkyl group having 6 to 12 carbon atoms and n is an integer from 10 to 30; polyoxyethylene castor oil and polyoxyethylene sorbitan fatty acid ester or the like.

[Cationic Emulsifier]

alkyl trimethylammonium chloride indicated by the following formula, $$RN^+(CH_3)_3Cl^-,$$

Wherein R represents an alkyl group having 12 to 23 carbon atoms; and di(polyoxyethylene)(a long chain alkyl group) methylammonium chloride.

[Anionic Emulsifier]

alkyl ether sulfate salt indicated by the following formula, $$RO—(CH_2CH_2O)_nSO_3Na,$$

wherein R represents an alkyl group having 12 to 23 carbon atoms and n is an integer from 1 to 5;

alkyl ether sulfonate salt and alkyl benzenesulfonate salt.

[Amphoteric Emulsifier]

betaine of acetic acid, imidazolium betaine or the like.

The present invention will be described in detail in conjunction with the following non-limiting examples and comparative examples.

[F Polymer]

To a 1 L autoclave equipped with a stirrer formed of a glass and supplied with a nitrogen atmosphere, there were charged 140 g of perfluoroalkylethyl acrylate ($CH_2═CHCOOCH_2CH_2(CF_2)_mF$ (m=6, 8, 10, 12, 14 (5/60/20/10/5% by weight), 12 g of dioctyl malate, 4 g of N-methylol acrylamide, 4 g of 2-hydroxyethyl acrylate, 350 g of ion-exchanged water, 50 g of acetone, 12 g of non-ionic emulsifier (polyoxyethyleneglycol monolauryl ether, Kao Corporation, Emulgen 420), 1 g of azo-initiator (Wako Pure Chemicals, V-50). Subsequently, 40 g of vinyl chloride was added under pressure. The reaction proceeded at 60° C. for 5 hours while stirring.

After completion of the reaction, a milky white water dispersion was obtained which comprises a polymer particle having a its diameter of about 0.1 μm. This dispersion was diluted with ion-exchanged water to give a dispersion having 20% by weight (hereinafter abbreviated to A solution).

[B Polymer]

B-1)

As usual procedure, reaction of hexamethylene diisocyanate and isophorone diisocyanate as an isocyanate component with polytetraethyleneglycol and carboxy-modified diol as a diol component gave an urethane polymer having 20% by weight (molecular weight 100,000, hereinafter abbreviated to B-1 solution).

B-2)

In the same manner, reaction of hexamethylene diisocyanate as an isocyanate component with polytetraethyleneglycol and carboxy-modified diol as a diol component gave an urethane polymer having 20% by weight (molecular weight 80,000, hereinafter abbreviated to B-2 solution).

B-3)

In the same manner as B-1 preparation procedure, reaction of hydrogenated MDI and PDI as an isocyanate component and polycarbonatediol of cyclohexyl dimethanol as a diol component gave an urethan polymer having 20% by weight (hereinafter abbreviated to B-3 solution).

Each measurement was conducted in the following procedure.

(Estimation of oil-absorptive character)

1. Sample Formation.

As described above broadly, a water dispersion (or solution) of the B polymer was fed into a clean glass plate which has a given box (15 cm×15 cm) formed by stacked adhesive tapes on the glass plate. After drying at room temperature for 30 minutes, this glass plate was preheated at 80° C. for 30 minutes. If a thickness of the resulting film was less than 100 μm, the above same operation was repeated. After stripping the adhesive tapes from the glass plate, further heat treatment was carried out at 140° C. for 30 minutes. In order to assist in stripping the resulting film, the glass plate provided with the resulting film was immersed in a hot water of 80° C. and followed by be allowed to stand for a long time to cool the film. The film thus treated was then stripped from the glass plate and this resultant film was dried in an air for 24 hours to give a sample film.

2. Measurement of Oil-absorptive Character.

The sample film thus obtained was cut into a size of 2 cm×5 cm accurately. Then, 10 ml of n-tetradecane was added to Petri dish and then the sample film was immersed in n-tetradecane. This film was allowed to stand for 24 hours in a thermostat apparatus kept at 20° C. After 24 hours, this film was removed from n-tetradecnae and sizes of length and breath were measured to determine [(area after immersion)/(area before immersion)]×100 value (%), that is to say, an area ratio, as estimate of oil-absorptive character. The results are tabulated in Table 1.

(Coating method)

A coating solution was coated on a polyester substrate (Toray, Lumirror sand mat) by means of the dip coating method to form a film after heating at 140° C. for 4 minutes. After immersion of the film at 120° C. for 1 second, this film was washed with water and the resulting film was dried at room temperature to obtain a recording layer provided on the substrate, that is a printing plate used in the present invention.

(Printing Test)

The resultant printing plate was mounted on waterless offset printer. Printing test was carried out utilizing a commercial ink. After 100 copies and 1,000 copies were printed, presence of toning in a non-imaged portion of paper was examined for each printing plate. The results are listed in Table 3.

EXAMPLE 1

A mixture comprising A solution and B-1 solution with a solid weight ratio of 30:70 was coated by means of the above coating method to form a recording layer. An observation of the surface of the recording layer prepared in EXAMPLE 1 under a scanning electron microscope (hereinafter abbreviated to SEM) revealed that this recording layer has an island structure which is formed by phase separation and in which there is distributed an island that comprises the F polymer having a diameter of 0.1 μm in a sea comprising the F polymer. In the following examples, surfaces of all samples were observed by means of SEM. These results are shown Table 2 (see below).

EXAMPLE 2

Preparation of a recording layer in this example was substantially similar to the EXAMPLE 1, except that B-2 solution was used in place of B-1 solution.

EXAMPLE 3

In the same manner as EXAMPLE 1, experiment was performed with a water dispersion of a urethane resin (ZENECA KK, AX-311), instead of B-1 solution.

COMPARATIVE EXAMPLE 1

The same procedure as EXAMPLE 1 except using a dispersion solution containing a urethane resin (Sumitomo Chemical, SuperFlex E4500) was carried out in this example.

COMPARATIVE EXAMPLE 2

The same procedure as EXAMPLE 1 except using a dispersion solution containing a urethane resin (Sumitomo Chemical, SuperFlex E2500) was carried out in this example.

COMPARATIVE EXAMPLE 3

The same procedure as EXAMPLE 1 except using B-3 solution was carried out in this example

COMPARATIVE EXAMPLE 4

The same procedure as EXAMPLE 1 except using a dispersion solution containing a urethane resin (Daiichi Koggyo Pharmaceuticals, NB11) was carried out in this example.

COMPARATIVE EXAMPLE 5

The same procedure as EXAMPLE 1 except using a dispersion solution containing a urethane resin (Sumitomo Chemical, Sumitex resin M-3) was carried out in this example.

TABLE 1

The results of estimation of oil-absorptive character as the B polymer.

| B polymer | Increase ratio in area 1) (%) | Estimate 2) |
|---|---|---|
| EXAMPLE 1 | 130 | ○ |
| EXAMPLE 2 | 135 | ○ |
| EXAMPLE 3 | 132 | ○ |
| COMPARATIVE EXAMPLE 1 | 100 | ○ |
| COMPARATIVE EXAMPLE 2 | 101 | ○ |
| COMPARATIVE EXAMPLE 3 | 109 | Δ |
| COMPARATIVE EXAMPLE 4 | 100 | X |
| COMPARATIVE EXAMPLE 5 | 100 | X |

1) This value was determined by immersion test with n-tetradecane.
2) Estimate standard is as follows.
○: good, Δ: slightly good, X: poor

TABLE 2

| The observation results of the surface of the recording layer prepared in each EXAMPLE under SEM. | Remark |
|---|---|
| EXAMPLE 1 | An island structure was observed in which an island having a diameter of 0.1 $\mu$m is distributed in a sea. |
| EXAMPLE 2 | An island structure was observed in which an island having a diameter of 0.1 $\mu$m is distributed in a sea. |
| EXAMPLE 3 | An island structure was observed in which an island having a diameter of 0.1 $\mu$m is distributed in a sea. |
| COMPARATIVE EXAMPLE 1 | An island structure was observed in which an island having a diameter of 0.1 $\mu$m is distributed in a sea. |
| COMPARATIVE EXAMPLE 2 | An island structure was observed in which an island having a diameter of 0.1 $\mu$m is distributed in a sea. |
| COMPARATIVE EXAMPLE 3 | An island structure was observed in which an island having a diameter of 0.1 $\mu$m is distributed in a sea. |
| COMPARATIVE EXAMPLE 4 | An island structure was observed in which an island having a diameter of 0.1 $\mu$m is distributed in a sea. |
| COMPARATIVE EXAMPLE 5 | An island structure was observed in which an island having a diameter of 0.1 $\mu$m is distributed in a sea. |

TABLE 3

The results of the printing test

| | TONING RESULT | |
|---|---|---|
| | After 100 copies | After 1000 copies |
| EXAMPLE 1 | ○ | ○ |
| EXAMPLE 2 | ○ | ○ |
| EXAMPLE 3 | ○ | ○ |
| COMPARATIVE EXAMPLE 1 | ○ | X |
| COMPARATIVE EXAMPLE 2 | ○ | X |
| COMPARATIVE EXAMPLE 3 | ○ | Δ |
| COMPARATIVE EXAMPLE 4 | ○ | X |
| COMPARATIVE EXAMPLE 5 | cracking | No measurement |

(Estimate Standard)
○: No toning was observed in a non-imaged area of printed matter.
Δ: A slight toning was observed in the non-imaged area of printed matter.
X: Toning was observed in the non-imaged area of printed matter.

From these results, it is seen that the recording layer comprising B polymer which has good oil-absorptive character determined by immersion test with n-tetradecane exhibits an excellent toning-resistant property during printing operation. Furthermore, it may be appreciated from the description hereinabove, that the printing plate according to the present invention has good ink-releasability.

The present invention is not limited to the specifically disclosed embodiments, and variations and modifications may be made without departing from scope of the present invention.

The present application is based on Japanese priority application No. 11-102405 filed on Apr. 9, 1999, the entire contents of which are hereby incorporated by reference.

What is claimed is:

1. A plate material for printing which comprises:

a substrate; and a recording layer provided on said substrate, wherein said recording layer comprises an exposed surface having a changeable property of a receding contact angle, wherein said surface comprises at least first and second exposed polymers, wherein said first polymer has said changeable property of said receding contact angle, and wherein said second polymer is selected from the group consisting of a styrene-butadiene resin, and a silicone resin, and has an oil-absorptive character defined as an area ratio determined by immersion test with a given solvent, wherein said area ratio is in a range of from 110% to 200%.

2. The plate material for printing as claimed in claim 1, wherein said first polymer is comprised of a copolymer including perfluoroalkyl-containing acrylate or perfluoroalkyl-containing methacrylate as a repeating unit.

3. The plate material for printing as claimed in claim 1, wherein said surface of said recording layer is a sea-island structure comprising said first polymer and said second polymer.

4. The plate material for printing as claimed in claim 1, wherein said given solvent is n-tetradecane.

5. The plate material for printing as claimed in claim 1, wherein said area ratio is in a range of from 110% to 135%.

6. A plate material for printing for use in a recording method comprising in an arbitrary order the following steps of:

(a) bringing a contact material into contact with an exposed surface of a recording layer, said surface having a property in which a receding contact angle decreases when said recording layer is heated in a state where said recording layer is in contact with a liquid, said contact material being selected from a liquid, a vapor and a solid which generates or changes to either a vapor or a liquid under condition of a temperature lower than a temperature at which said receding contact angle on said recording layer starts to decrease; and (b) selectively heating said surface of said recording layer in response to an image information, whereby an area is formed with a receding contact angle in response to a heating temperature on said recording layer, said plate material comprising:

a substrate; and said recording layer provided on said substrate, wherein said surface of said recording layer has a changeable property of said receding contact angle and comprises at least first and second exposed polymers, wherein said first polymer has said changeable property of said receding contact angle, and wherein said second polymer is selected from the group consisting of a styrene-butadiene resin, and a silicone resin and has an oil-absorptive character defined as an area ratio determined by immersion test with a given solvent, and wherein said area ratio is in a range of from 110% to 200%.

7. The plate material for printing as claimed in claim 6, wherein said first polymer is comprised of a copolymer including perfluoroalkyl-containing acrylate or perfluoroalkyl-containing methacrylate as a repeating unit.

8. The plate material for printing as claimed in claim 6, wherein said surface of said recording layer is a sea-island structure comprising said first polymer and said second polymer.

9. The plate material for printing as claimed in claim 6, wherein said given solvent is n-tetradecane.

10. The plate material for printing as claimed in claim 6, wherein said area ratio is in a range of from 110% to 135%.

11. A plate material for printing for use in a recording method comprising the step of:

selectively heating an exposed surface of a recording layer, said surface having a property in which a receding contact angle which was pre-decreased when said recording layer was heated in a state where said recording layer was in contact with a liquid changes into a original state when said recording layer is heated in an air in the absence of a liquid, whereby an area is formed with a receding contact angle in response to a heating temperature on said recording layer, said plate material comprising:

a substrate; and said recording layer provided on said substrate, wherein said surface of said recording layer has a changeable property of said receding contact angle and comprises at least first and second exposed polymers, wherein said first polymer has said changeable property of said receding contact angle, and wherein said second polymer is selected from the group consisting of a styrene-butadiene resin, and a silicone resin and has an oil-absorptive character defined as an area ratio determined by immersion test with a given solvent, and wherein said area ratio is in a range of from 110% to 200%.

12. The plate material for printing as claimed in claim 11, wherein said first polymer is comprised of a copolymer including perfluoroalkyl-containing acrylate or perfluoroalkyl-containing methacrylate as a repeating unit.

13. The plate material for printing as claimed in claim 11, wherein said surface of said recording layer is a sea-island structure comprising said first polymer and said second polymer.

14. The plate material for printing as claimed in claim 11, wherein said given solvent is n-tetradecane.

15. The plate material for printing as claimed in claim 11, wherein said area ratio is in a range of from 110% to 135%.

* * * * *